US011626309B2

(12) United States Patent
You

(10) Patent No.: US 11,626,309 B2
(45) Date of Patent: Apr. 11, 2023

(54) SUBSTRATE TREATING APPARATUS AND SUBSTRATE TREATING METHOD

(71) Applicant: SEMES CO., LTD., Chungcheongnam-do (KR)

(72) Inventor: Jun Ho You, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 17/513,734

(22) Filed: Oct. 28, 2021

(65) Prior Publication Data
US 2022/0130703 A1 Apr. 28, 2022

(30) Foreign Application Priority Data
Oct. 28, 2020 (KR) ........................ 10-2020-0141436

(51) Int. Cl.
*H01L 21/68* (2006.01)
*G03F 7/20* (2006.01)
*H01L 21/687* (2006.01)

(52) U.S. Cl.
CPC ........ *H01L 21/681* (2013.01); *G03F 7/70775* (2013.01); *H01L 21/68707* (2013.01); *H01L 21/68735* (2013.01)

(58) Field of Classification Search
CPC ............. H01L 21/681; H01L 21/68707; H01L 21/68735
See application file for complete search history.

(56) References Cited

U.S. PATENT DOCUMENTS

| 6,198,976 | B1 * | 3/2001 | Sundar | H01L 21/681 700/121 |
| 2006/0215152 | A1 * | 9/2006 | Hashimoto | H01L 21/681 356/237.2 |
| 2016/0351425 | A1 * | 12/2016 | Kim | H01L 21/67766 |
| 2017/0372933 | A1 * | 12/2017 | Kim | H01L 21/681 |
| 2019/0115239 | A1 | 4/2019 | Eum et al. | |
| 2022/0254666 | A1 * | 8/2022 | Sadeghi | H01L 21/68742 |
| 2022/0301912 | A1 * | 9/2022 | Kuwahara | H01L 21/68707 |

FOREIGN PATENT DOCUMENTS

| JP | 2008182127 A | | 8/2008 | |
| JP | 2012182393 A | * | 9/2012 | ........ H01L 21/6715 |
| JP | 2014132667 A | | 7/2014 | |
| JP | 2014197713 A | | 10/2014 | |
| JP | 2016063039 A | | 4/2016 | |
| JP | 2020088374 A | | 6/2020 | |

(Continued)

*Primary Examiner* — Gerald McClain
(74) *Attorney, Agent, or Firm* — Procopio, Cory, Hargreaves & Savitch LLP

(57) ABSTRACT

A substrate treating method includes measuring an alignment state of a substrate placed on a hand of a transfer unit that transfers the substrate, transferring the substrate to a substrate alignment unit by the transfer unit when the alignment state of the substrate is faulty, aligning a location of the substrate by the substrate alignment unit, and temporarily correcting the location of the substrate before the substrate is loaded on the substrate alignment unit when it is measured in the measuring of the alignment state that the alignment state of the substrate exceeds a sensor reading range.

14 Claims, 12 Drawing Sheets

(56) References Cited

FOREIGN PATENT DOCUMENTS

| | | | |
|---|---|---|---|
| KR | 1020120033226 A | | 4/2012 |
| KR | 20130092371 A | * | 8/2013 |
| KR | 1020130092371 A | | 8/2013 |
| KR | 101329327 B1 | | 11/2013 |
| KR | 101524335 B1 | | 5/2015 |
| KR | 101736849 B1 | | 5/2017 |
| KR | 10-2018-0006710 A | | 1/2018 |
| KR | 1020180001620 A | | 1/2018 |
| KR | 10-2018-0053967 A | | 5/2018 |
| KR | 1020190041155 A | | 4/2019 |
| WO | 2016032241 A1 | | 3/2016 |

* cited by examiner

FIG. 13

| Misalignment direction / Location detection member | 0° | 45° | 90° | 135° | 180° | 225° | 270° | 315° |
|---|---|---|---|---|---|---|---|---|
| First sensor | On | On | On | On | Off | Off | Off | On |
| Second sensor | Off | On | On | On | On | On | Off | Off |
| Third sensor | Off | Off | Off | On | On | On | On | On |
| Fourth sensor | On | On | Off | Off | Off | On | On | On |

SUBSTRATE TREATING APPARATUS AND SUBSTRATE TREATING METHOD

CROSS-REFERENCE TO RELATED APPLICATIONS

A claim for priority under 35 U.S.C. § 119 is made to Korean Patent Application No. 10-2020-0141436 filed on Oct. 28, 2020, in the Korean Intellectual Property Office, the entire contents of which are hereby incorporated by reference.

BACKGROUND

Embodiments of the inventive concept described herein relate to a substrate treating apparatus and a substrate treating method, and relates to a substrate treating apparatus and a substrate treating method for a misaligned substrate in a hand, exceeding a substrate accommodation range of a physical centering buffer.

In order to manufacture a semiconductor device, various processes such as a deposition process, a photographing process, an etching process, and a cleaning process are performed. Apparatuses performing some of these processes have a plurality of chambers. After processes on substrates are performed in one chamber, the substrates are transferred to another chamber.

According to an example, a substrate treating apparatus that performs the photographing process includes various chambers such as an application chamber in which a photosensitive liquid such as photoresist is applied to the substrate, a baking chamber in which the substrate is heated or cooled before or after the application of the photosensitive liquid, and an edge exposure chamber in which an edge area of the substrate is exposed. The substrates are transferred to these chambers in a preset order.

The substrate should be placed in a predetermined regular location on a unit supporting the substrate in the chamber. When the process is performed in a state in which the substrate is not placed in a regular location, a process defect is likely to occur. For example, when a process of treating an edge region of the substrate is performed in a state in which the substrates are not aligned, specific chemicals or rinsing solutions unintentionally affect the center of the substrate, and thus the quality of process output cannot satisfy the standard. In some cases, the center and the edge of the substrate exposed to the chemicals or rinsing solutions may be damaged.

Thus, the substrates should be aligned when being transferred while deviating from a regular location on a transfer unit or when deviating from the regular location on the unit supporting the substrate in the chamber.

In general, when the location of the substrate exceeds a sensor reading range or a unit accommodation range, the substrates are aligned within the sensor reading range in a centering buffer unit capable of physical centering. In this case, an accommodation range of the centering buffer unit should exceed a substrate movement range in a hand.

When the misalignment location of the substrate exceeds the accommodation range of the centering buffer unit, the transfer unit is stopped, and the substrates should be moved to a central location artificially (by a user).

FIG. 1 is a view illustrating a problem when a substrate in a state of deviating from the accommodation range is aligned in the centering buffer unit, and FIG. 2 is a view illustrating a problem when the accommodation range is increased to solve the problem of FIG. 1.

SUMMARY

Embodiments of the inventive concept provide a substrate treating apparatus and a substrate treating method capable of efficiently aligning a substrate even when a misalignment location of the substrate exceeds an accommodation range of a centering buffer unit.

Further, embodiments of the inventive concept provide a substrate treating apparatus and a substrate treating method capable of reducing a time required for alignment while increasing the alignment accuracy of a substrate.

The aspect of the inventive concept is not limited thereto, and other unmentioned aspects of the inventive concept may be clearly appreciated by those skilled in the art from the following descriptions.

According to an embodiment, a substrate treating method includes measuring an alignment state of a substrate placed on a hand of a transfer unit that transfers the substrate, transferring the substrate to a substrate alignment unit by the transfer unit when the alignment state of the substrate is faulty, and aligning a location of the substrate by the substrate alignment unit, wherein the substrate treating method further includes temporarily correcting the location of the substrate before the substrate is loaded on the substrate alignment unit when it is measured in the measuring of the alignment state that the alignment state of the substrate exceeds a sensor reading range.

Further, the temporarily correcting of the location may include determining misalignment directionality of the substrate using a measurement value of the measuring of the alignment state, and offsetting a location of the hand by a preset interval in a direction that is opposite to a misalignment direction of the substrate.

Further, the preset interval may correspond to a reading range of a sensor that is installed in the hand and measures the alignment state of the substrate.

Further, in the measuring of the alignment state, four sensors installed in the hand may detect four end locations on the substrate.

Further, the sensor may emit light toward the substrate placed in the hand and measure a degree of misalignment of the substrate using an area of detected light.

Further, in the determining of the misalignment directionality, the misalignment direction of the substrate may be identified through a non-detection sensor, exceeding the sensor reading range, among the four sensors.

According to an embodiment, a substrate treating apparatus includes a substrate alignment unit that aligns a substrate, a transfer unit that has a hand on which a substrate is placed and location sensors that measure a location of the substrate on the hand and transfers the substrate to the substrate alignment unit, and a teaching unit that sets a transfer location at which the substrate is transferred onto the substrate alignment unit by the transfer unit, wherein the teaching unit measures, using the location sensors, positional misalignment of the substrate placed on the hand, and corrects a transfer location of the hand before the substrate placed on the hand is seated on the substrate alignment unit when an alignment state of the substrate exceeds a sensor reading range of the location sensor.

Further, the teaching unit may determine misalignment directionality of the substrate using the measurement values of the location sensors.

Further, in the teaching unit, four location sensors installed in the hand may detect four end locations on the substrate.

Further, the teaching unit may identify a misalignment direction of the substrate through a non-detection location sensor, exceeding the sensor reading range, among the four location sensors.

Further, the teaching unit may offset the transfer location of the hand by a preset interval in a direction that is opposite to the misalignment direction of the substrate.

Further, the preset interval may correspond to a reading range of the location sensor.

Further, the substrate alignment unit may include a support plate, and a plurality of alignment pins that is coupled to an upper surface of the support plate and aligns the location of the substrate.

Further, the alignment pin may have an inclination part having a shape of a cone or truncated cone of which a cross section becomes wider toward the lower side.

According to an embodiment, a substrate treating method of treating a substrate using substrate treating equipment including a transfer chamber in which a transfer robot that transfers the substrate is provided, a plurality of process chambers which are provided at a lateral part of the transfer chamber and in which the substrate is treated, and a substrate alignment unit which is provided at the lateral part of the transfer chamber includes measuring an alignment state of the substrate placed on a hand of the transfer robot, and aligning the substrate by transferring the substrate to the substrate alignment unit by the transfer robot when the alignment stage of the substrate is faulty, wherein the substrate treating method includes temporarily correcting a location of the substrate before the substrate is loaded on the substrate alignment unit when the alignment state of the substrate exceeds a substrate accommodation range of the substrate alignment unit in the measuring of the alignment state.

Further, the temporarily correcting of the location of the substrate may include determining misalignment directionality of the substrate using measurement values of location sensors installed in the hand, and wherein the determining of the misalignment directionality may include identifying a misalignment direction of the substrate through a non-detection location sensor, exceeding a sensor reading range, among the location sensors.

Further, the temporarily correcting of the location of the substrate may further include offsetting a location of the hand by a preset interval in a direction that is opposite to the misalignment direction of the substrate.

Further, the preset interval may correspond to a reading range of a sensor that is installed in the hand and measures the alignment state of the substrate.

Further, in the measuring of the alignment state, four sensors installed in the hand may detect four end locations on the substrate.

Further, the sensor may emit light toward the substrate placed in the hand and measure a degree of misalignment of the substrate using an area of detected light.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 13 is a table illustrating a misalignment direction of the substrate through a non-detection sensor deviating from the sensor reading range among the location detection members;

DETAILED DESCRIPTION

Figure 1:
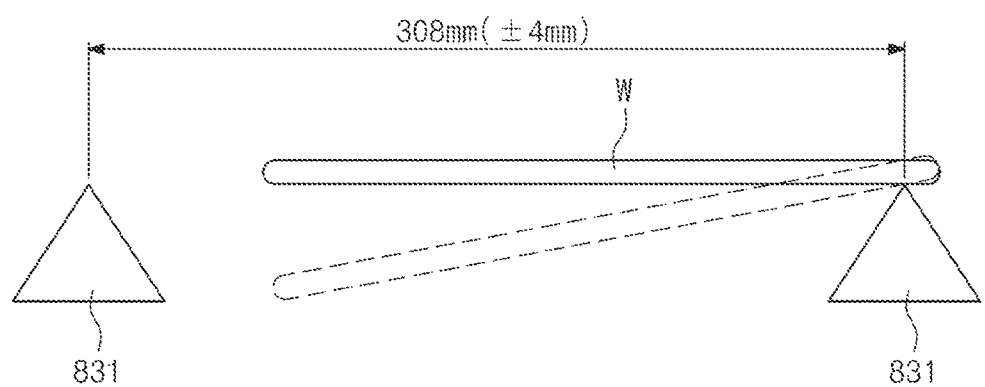
FIG. 1 is a view illustrating a problem when a substrate in a state of deviating from an accommodation range is aligned in a centering buffer unit.

Hereinafter, exemplary embodiments of the inventive concept will be described in detail with reference to the accompanying drawings so that those skilled in the art to which the inventive concept pertains may easily carry out the inventive concept. However, the inventive concept may be implemented in various different forms, and is not limited to the embodiments. Further, in a description of the embodiments of the inventive concept, a detailed description of related known functions or configurations will be omitted when they make the essence of the inventive concept unnecessarily unclear. In addition, the same reference numerals are used for parts that perform similar functions and operations throughout the drawings.

The expression of 'including' some elements may mean that another element may be further included without being excluded unless there is a particularly contradictory description. In detail, the terms "including" and "having" are used to designate that the features, the numbers, the steps, the operations, the elements, the parts, or combination thereof described in the specification are present, and may be understood that one or more other features, numbers, step, operations, elements, parts, or combinations thereof may be added.

Singular expressions include plural expressions unless clearly otherwise indicated in the context. Further, in the drawings, the shapes and sizes of the elements may be exaggerated for clearer description.

Equipment of the present embodiment may be used to perform a photolithography process on a substrate such as a semiconductor wafer or a flat display panel. In particular, the equipment of the present embodiment may be connected to an exposure device to perform an application process and a development process on the substrate. Hereinafter, a case in which a wafer is used as the substrate will be described as an example.

Figure 3:
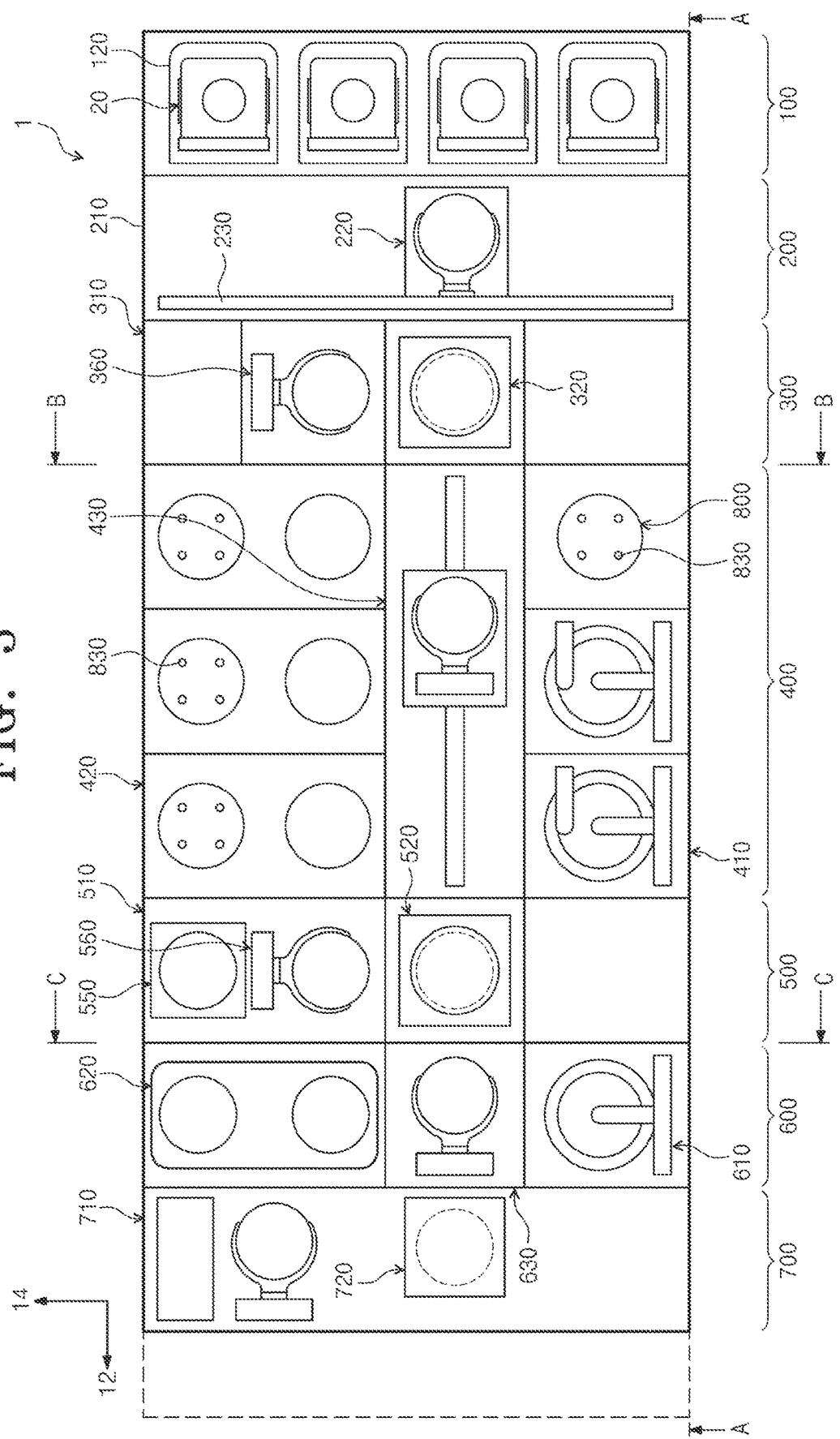
FIG. 3 is a view illustrating substrate treating equipment according to one embodiment of the inventive concept when viewed from the top.
Figure 4:
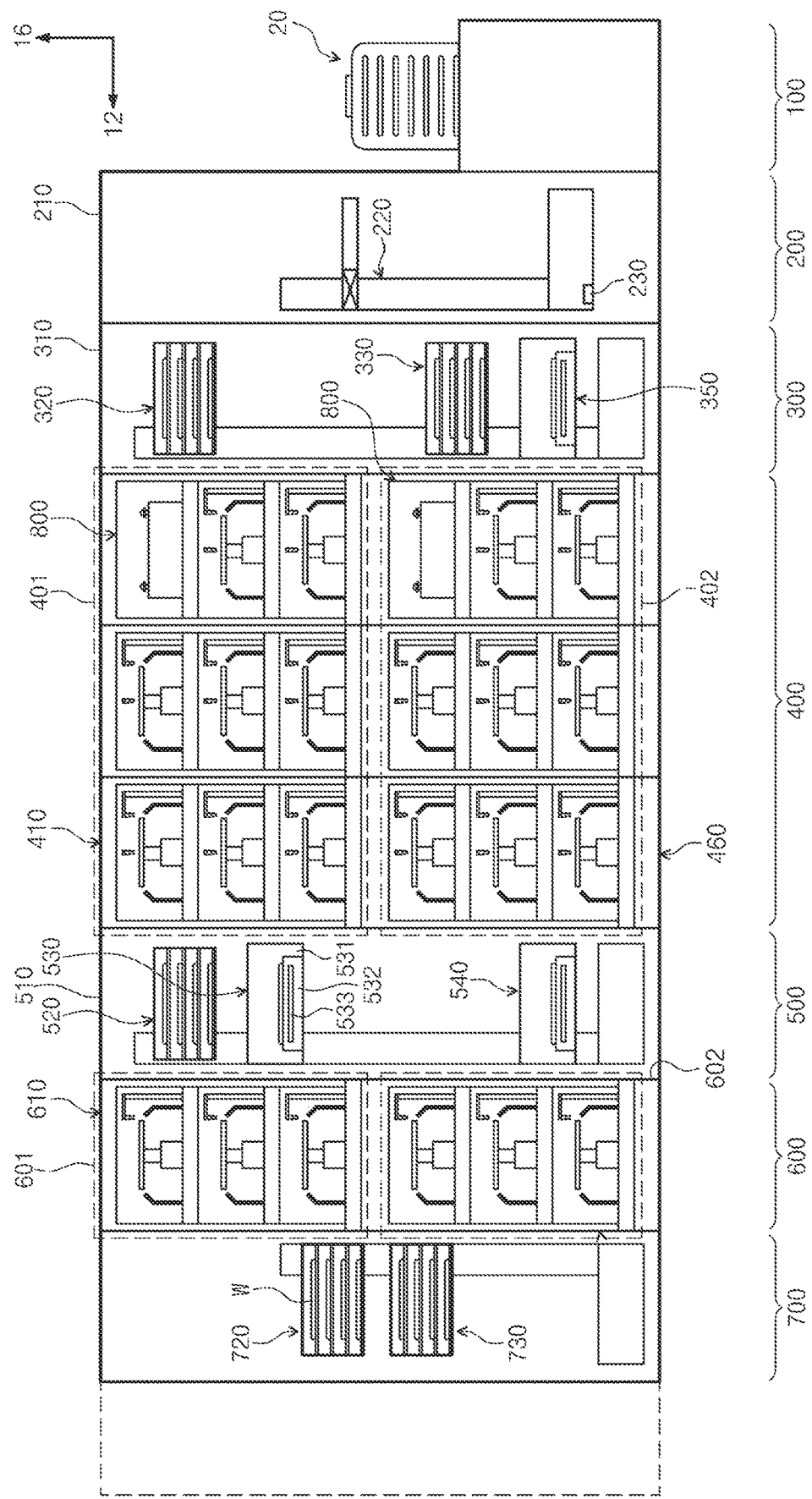
FIG. 4 is a view taken along line A-A of the equipment of FIG. 3.
Figure 5:
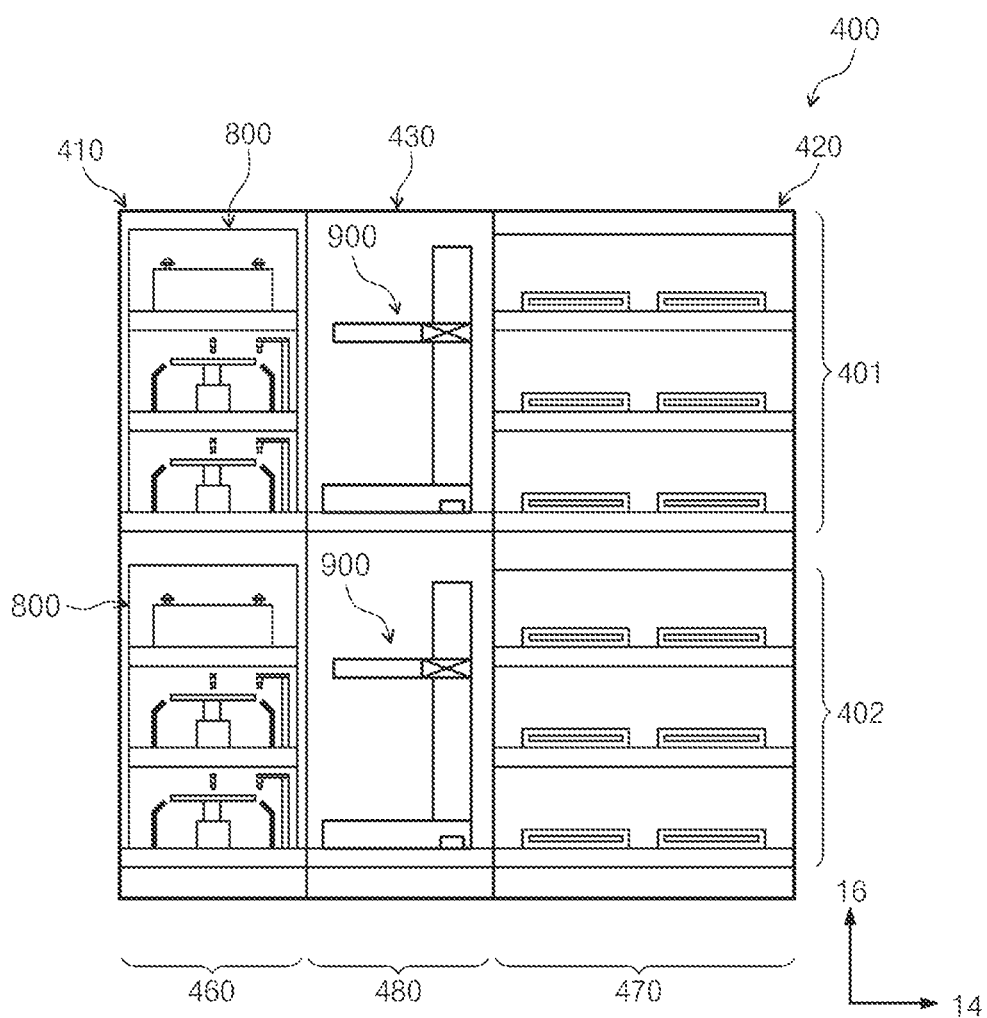
FIG. 5 is a view taken along line B-B of the equipment of FIG. 3.
Figure 6:
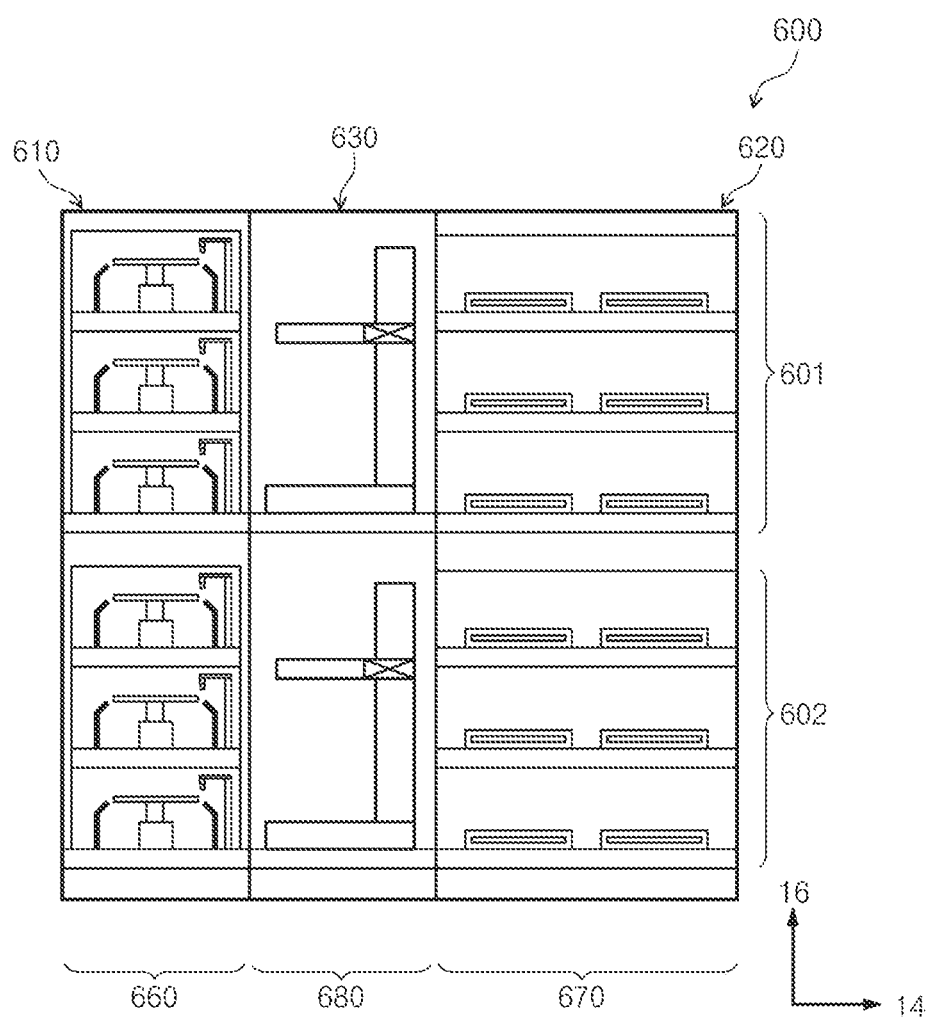
FIG. 6 is a view taken along line C-C of the equipment of FIG. 3.

FIGS. 3 to 6 are schematic views illustrating substrate treating equipment according to one embodiment of the inventive concept. FIG. 3 is a view illustrating substrate treating equipment according to one embodiment of the inventive concept when viewed from the top, FIG. 4 is a view taken along line A-A of the equipment of FIG. 3, FIG. 5 is a view taken along line B-B of the equipment of FIG. 3, and FIG. 6 is a view taken along line C-C of the equipment of FIG. 3.

Referring to FIGS. 3 to 6, a substrate treating equipment 1 includes a load pot 100, an index module 200, a first buffer module 300, an application and development module 400, a second buffer module 500, a pre-exposure or post-exposure treating module 600, and an interface module 700.

Hereinafter, a direction, in which the load pot 100, the index module 200, the first buffer module 300, the application and development module 400, the second buffer module 500, the pre-exposure or post-exposure treating module 600, and the interface module 700 are arranged, refers to a first direction 12, a direction that is perpendicular to the first direction 12 when viewed from the top refers to a second direction 14, and a direction that is perpendicular to the first direction 12 and the second direction 14 refers to a third direction 16.

A substrate "W" is moved while being accommodated in a cassette 20. In this case, the cassette 20 has a structure that may be sealed from the outside. For example, a front open unified pod (FOUP) having a door on a front side thereof may be used as the cassette 20.

Hereinafter, the load pot 100, the index module 200, the first buffer module 300, the application and development module 400, the second buffer module 500, the pre-exposure or post-exposure treating module 600, and the interface module 700 will be described in detail.

The load pot 100 has a mounting table 120 on which the cassette 20 in which the substrates "W" are accommodated is placed. The mounting table 120 is provided as a plurality of mounting tables 120, and the mounting tables 120 are aligned in the second direction 14. In FIG. 3, four mounting tables 120 are provided.

The index module 200 moves the substrate "W" between the first buffer module 300 and the cassette 20 placed on the mounting table 120 of the load pot 100. The index module 200 has a frame 210, an index robot 220, and a guide rail 230. The frame 210 is provided in a substantially rectangular parallelepiped shape having an empty interior and is disposed between the load pot 100 and the first buffer module 300.

The first buffer module 300 has a frame 310, a first buffer 320, a second buffer 330, a cooling chamber 350, and a first buffer robot 360. The frame 310 is provided in a rectangular parallelepiped shape having an empty interior and is disposed between the index module 200 and the application and development module 400. The first buffer 320, the second buffer 330, the cooling chamber 350, and the first buffer robot 360 are located inside the frame 310. The first buffer 320 and the second buffer 330 temporarily store the plurality of substrates "W". The first buffer robot 360 moves the substrate "W" between the first buffer 320 and the second buffer 330. The cooling chamber 350 cools the substrate "W".

The application and development module 400 performs a process of applying photoresist onto the substrate "W" before an exposure process and a process of developing the substrate "W" after the exposure process. The application and development module 400 has a substantially rectangular parallelepiped shape. The application and development module 400 has an application module 401 and a development module 402.

The application module 401 and the development module 402 are arranged to be partitioned from each other in layers. According to an example, the application module 401 is located above the development module 402.

The application module 401 performs a process of applying a photosensitive liquid such as the photoresist onto the substrate "W" and a heat treatment process of heating or cooling the substrate "W" before and after the resist application process.

The application module 401 has a resist application chamber 410, a baking chamber 420, and a transfer chamber 430. The resist application chamber 410, the baking chamber 420, and the transfer chamber 430 are sequentially arranged in the second direction 14. Thus, the resist application chamber 410 and the baking chamber 420 are located to be spaced apart from each other in the second direction 14 with the transfer chamber 430 interposed therebetween.

The resist application chamber 410 is provided as a plurality of resist application chambers 410, and the plurality of resist application chambers 410 are provided in the first direction 12 and the third direction 16. An example in which six resist application chambers 410 are provided is illustrated in the drawing.

The baking chamber 420 heat-treats the substrate "W". For example, the baking chambers 420 perform a pre-baking process of, before the photoresist is applied, heating the substrate "W" to a predetermined temperature to remove organic matters or moisture from a surface of the substrate "W", a soft barking process performed after the photoresist is applied onto the substrate "W", and a cooling process of cooling the substrate "W" after the heating process.

The transfer chamber 430 is located in parallel with the first buffer 320 of the first buffer module 300 in the first direction 12.

The development module 402 performs a development process of, to obtain a pattern on the substrate "W", supplying a developer and removing a part of the photoresist and a heat treatment process of heating or cooling the substrate "W" before and after the development process. The development module 402 has a development chamber 460, a baking chamber 470, and a transfer chamber 480. The development chamber 460, the baking chamber 470, and the transfer chamber 480 are sequentially arranged in the second direction 14.

The development chambers 460 have the same structure. However, the types of developers used in the development chambers 460 may be different from each other. The development chamber 460 removes a region, irradiated with light, of the photoresist on the substrate "W". In this case, a region, irradiated with the light, of a protective film is removed together. Only a region, not irradiated with the light, among the region of the photoresist and the region of the protective film may be removed according to the types of the selectively used photoresist.

The baking chamber 470 of the development module 402 heat-treats the substrate "W". For example, the baking chamber 470 performs a post-baking process of heating the substrate "W" before the development process, a hard baking process of heating the substrate "W" after the development process, a cooling process of cooling the heated substrate "W" after the baking processes, and the like.

The second buffer module 500 is provided as a passage through which the substrate "W" is transported between the application and development module 400 and the pre-exposure or post-exposure treating module 600. Further, the second buffer module 500 performs a predetermined process such as a cooling process or an edge exposure process on the substrate "W". The second buffer module 500 has a frame 510, a buffer 520, a first cooling chamber 530, a second cooling chamber 540, an edge exposure chamber 550, and a second buffer robot 560.

When the exposure device performs an immersion exposure process, the pre-exposure or post-exposure treating module 600 may process a process of applying a protective film protecting the photoresist film applied to the substrate "W" during immersion exposure. Further, the pre-exposure or post-exposure treating module 600 may perform a process of cleaning the substrate "W" after the exposure. Further, when the application process is performed using a chemically amplified resist, the pre-exposure or post-exposure treating module 600 may perform the baking process after the exposure.

The pre-exposure or post-exposure treating module 600 has a pre-treatment module 601 and a post-treatment module 602. The pre-treatment module 601 performs a process of treating the substrate "W" before the exposure process, and the post-treatment module 602 performs a process of treating the substrate "W" after the exposure process.

In the pre-exposure or post-exposure treating module 600, the pre-treatment module 601 and the post-treatment module 602 are provided to be completely separated from each other.

The pre-treatment module 601 has a protective film application chamber 610, a baking chamber 620, and a transfer chamber 630. The protective film application chamber 610, the transfer chamber 630, and the baking chamber 620 are sequentially arranged in the second direction 14.

Thus, the protective film application chamber 610 and the baking chamber 620 are located to be spaced apart from each other in the second direction 14 with the transfer chamber 630 interposed therebetween. A plurality of protective film application chambers 610 are provided, and are arranged in the third direction 16 to form layers therebetween.

The protective film application chambers 610 may optionally be provided in the first direction 12 or the third direction 16. A plurality of baking chambers 620 are provided and are arranged in the third direction 16 to form layers therebetween. The plurality of baking chambers 620 may optionally be provided in the first direction 12 or the third direction 16.

The post-treatment module 602 has a cleaning chamber 660, a post-exposure baking chamber 670, and a transfer chamber 680. The cleaning chamber 660, the transfer chamber 680, and the post-exposure baking chamber 670 are sequentially arranged in the second direction 14.

Thus, the cleaning chamber 660 and the post-exposure baking chamber 670 are located to be spaced apart from each other in the second direction 14 with the transfer chamber 680 interposed therebetween. A plurality of cleaning chambers 660 may be provided and may be arranged in the third direction 16 to form layers therebetween.

The plurality of cleaning chambers 660 may optionally be provided in the first direction 12 or the third direction 16. A plurality of post-exposure baking chambers 670 may be provided and may be arranged in the third direction 16 to form layers therebetween. The plurality of post-exposure baking chambers 670 may optionally be provided in the first direction 12 or the third direction 16.

The interface module 700 moves the substrate "W" between the pre-exposure or post-exposure treating modules 600. The interface module 700 has a frame 710, a first buffer 720, a second buffer 730, and an interface robot 740. The first buffer 720, the second buffer 730, and the interface robot 740 are located inside the frame 710.

The first buffer 720 and the second buffer 730 are spaced apart from each other by a predetermined distance and are arranged to be stacked on each other. The first buffer 720 is disposed to be higher than the second buffer 730. The first buffer 720 is located at a height corresponding to the pre-treatment module 601, and the second buffer 730 is located at a height corresponding to the post-treatment module 602. When viewed from the top, the first buffers 720 are aligned in the first direction 12 with respect to the transfer chamber 630 of the pre-treatment module 601, and the second buffers 730 are aligned in the first direction 12 with respect to the transfer chamber 680 of the post-treatment module 602.

One embodiment of the inventive concept relates to a substrate alignment device 800 which is provided in the equipment as configured above and is provided to the application and development module 400.

Figure 7A:
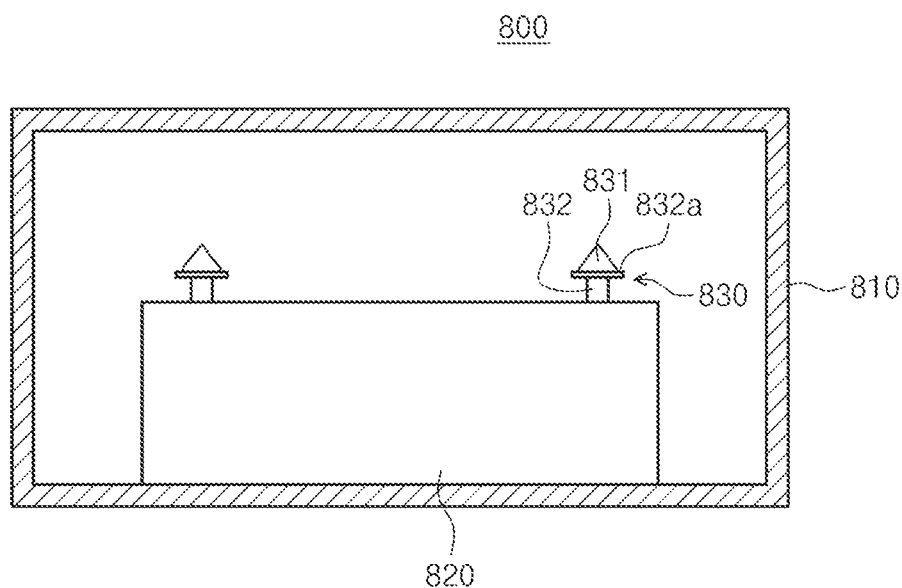
FIGS. 7A and 7B are a cross-sectional view of an alignment device provided in an application and development module of FIG. 3.
Figure 7B:
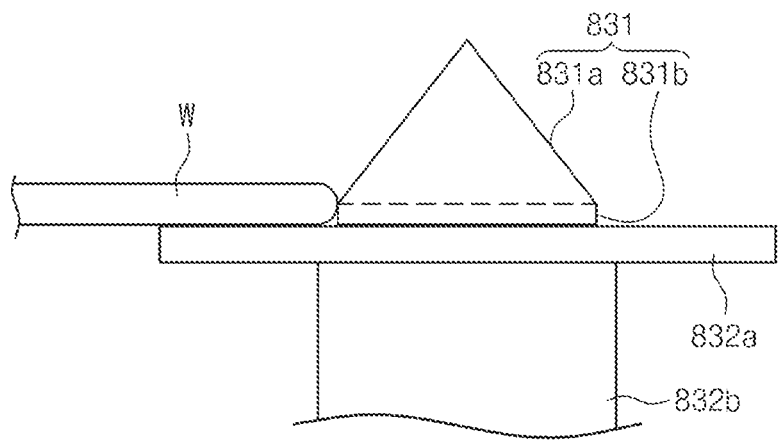

As illustrated in FIGS. 7A and 7B, the substrate alignment device 800 includes a chamber 810, a support plate 820, and a guide unit 830.

The chamber 810 has an opening through which the substrate "W" is introduced or discharged. The chamber 810 may be provided to each of the application module 401 and the development module 402. The support plate 820 is provided inside the chamber 810.

The guide unit 830 is installed on the support plate 820. The guide unit 830 is provided as a plurality of guide units 830. The guide units 830 are combined with each other to provide a space in which the substrate "W" is placed. The guide unit 830 includes an alignment pin 831 and a fixing body 832. The alignment pin 831 aligns the substrate "W" at a regular location. The fixing body 832 has a support surface 832a that supports an edge region of the substrate "W" in an aligned state. The fixing body 832 is fixedly coupled to the support plate 820.

The alignment pin 831 includes an inclination part 831a and a body part 831b. The inclination part 831a is provided in the shape of a cone or truncated cone of which the cross section becomes wider toward the lower side. The body part 831b extends downward from the inclination part 831a to the fixing body 832 and has a side portion provided to be perpendicular to the support plate 820. A height H2 of the body part 831b is smaller than a thickness H1 of the substrate "W". According to one example, the height H2 of the body part 831b is not smaller than a half of the thickness H1 of the substrate "W". For example, the height H2 of the body part 831b may be the half of the thickness H1 of the substrate "W".

The fixing body 832 includes a support body 832b and a support shaft 832c. The support body 832b has a cylindrical shape and has an upper surface on which the support surface 832a is provided. The support shaft 832c extends from the support body 832b and is fixedly coupled to the support plate 820.

When the substrate "W" is placed between the guide units 830, the substrate "W" is lowered on the inclination part 831a.

The transfer of the substrate "W" between the substrate alignment device 800, the application chamber 410, the baking chambers 420 and 470, and the development chamber 460 as configured above is performed by transfer robots 900 provided in the transfer chambers 430 and 480.

The transfer robot 900 is provided in the transfer chamber 430. The transfer robot 900 includes a hand 910 and a location detection member 920. A teaching unit 930 corresponds to a controller that sets and controls a transfer location of the transfer robot 900.

The hand 910 moves the substrate "W" to the process chambers or the substrate alignment device 800.

Figure 8:
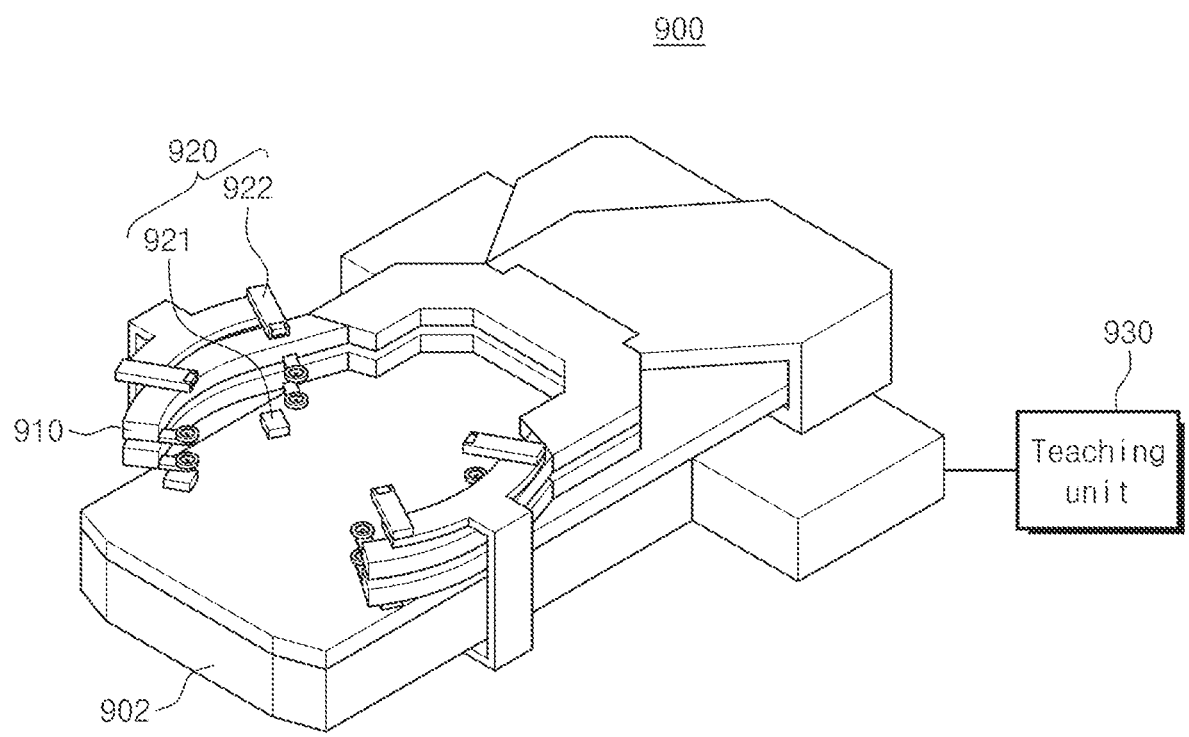
FIG. 8 is a view illustrating a hand in which a location detection member is installed.
Figure 9:
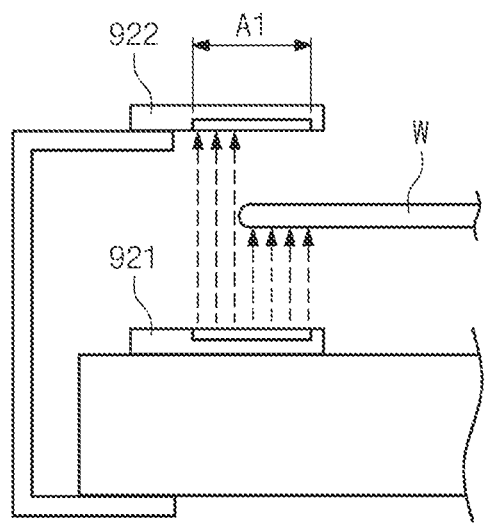
FIG. 9 is a view for describing the location detection member.
Figure 10:
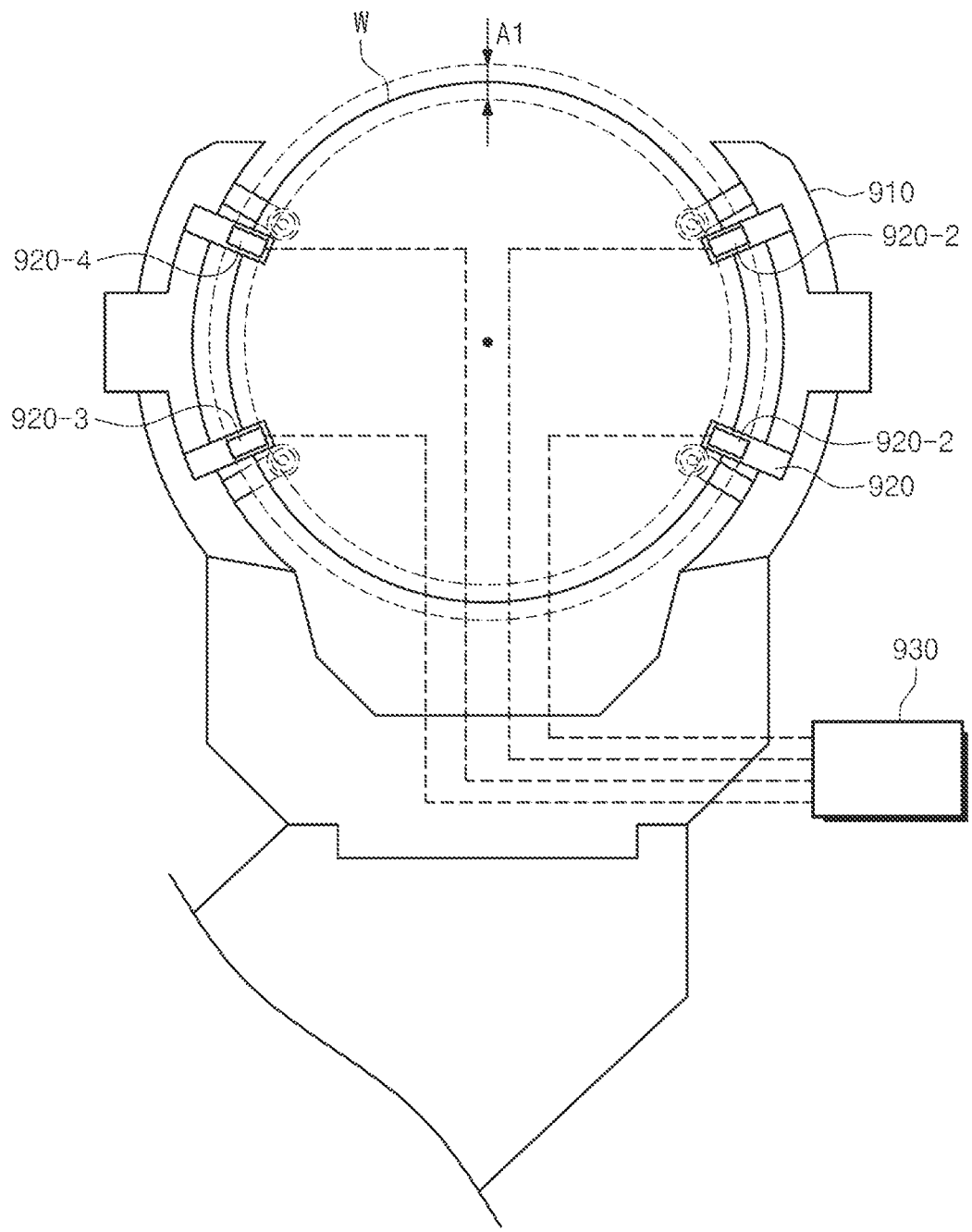
FIG. 10 is a view illustrating a sensor reading range of the location detection member.

FIG. 8 is a view illustrating a hand in which a location detection member is installed, FIG. 9 is a view for describing the location detection member, and FIG. 10 is a view illustrating a sensor reading range of the location detection member.

Referring to FIGS. 8 to 10, the location detection member 920 is provided in a base part 902 in which the hand 910 is installed. The location detection member 920 measures an alignment state of the substrate "W". The teaching unit 930 receives a signal from the location detection member 920, and determines the alignment state of the substrate "W". When it is determined that the alignment state of the substrate "W" seated on the hand 910 is faulty, the teaching unit 930 controls the transfer robot 900 so that the substrate "W" is transferred to the substrate alignment device 800.

The location detection member 920 detects an end location on the substrate "W" held by the hand 910. The location detection member 920 is installed in the base part 902. The location detection member 920 may be provided as a plurality of location detection members 920. As an example, four location detection members 920 may be provided at locations facing each other. In this case, the location detection member 920 may detect four end locations on the substrate "W". As an example, the location detection member 920 may be provided as a laser displacement sensor. As illustrated in FIG. 10, the four location detection members 920 may be defined as a first sensor 920-1, a second sensor 920-2, a third sensor 920-3, and a fourth sensor 920-4.

The location detection member 920 emits light toward the substrate "W" placed on the hand 910 and measures a misalignment degree of the substrate "W" using an area of the detected light. As an example, the location detection member 920 may include a light emitting unit 921 and a light receiving unit 922.

The light emitting unit 921 irradiates light. A light source of the light irradiated by the light emitting unit 921 may be provided as laser light. In contrast, a light source of the light emitting unit 921 may be provided as a light emitting diode (LED).

The light receiving unit 922 receives the light irradiated by the light emitting unit 921. The light receiving unit 922 may measure the location of the substrate "W" according to the amount of the received light. As an example, the amount of light irradiated by the light emitting unit 921 when there is no substrate "W" is defined as a reference value. Thereafter, in a state in which the substrate "W" is held by the hand 910, when the light is irradiated by the light emitting unit 921, the location of the substrate "W" is measured through the amount of the received light except for the amount of light blocked by the substrate "W". A range A1 illustrated in FIGS. 9 and 10 shows the sensor reading range of the location detection member. For example, when the size of the substrate "W" is 300 mm, the reading range of the location detection member 920 may be ±4 mm (PCD 308 mm). Further, a substrate accommodation range on the hand 910 may be ±6 mm (PCD 312 mm) which is wider than the sensor reading range. Thus, the substrate "W" may be placed at a location of the hand 910, which deviates from the sensor reading range.

The light receiving unit 922 receives laser light when the location detection member 920 is provided as the laser displacement sensor. Unlike this, when the light emitting unit 921 irradiates LED light, the light receiving unit 922 may be provided as a linear image sensor. As an example, various linear image sensors such as a charge coupled device (CCD) line sensor, a fiber line sensor, and a photoelectric sensor may be provided as the linear image sensor.

Figure 14A:
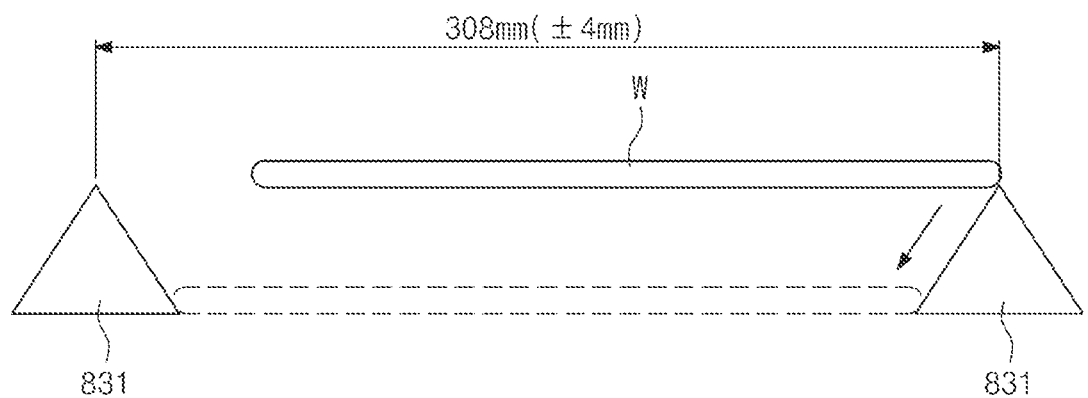
FIGS. 14A to 14C are views illustrating various types of substrate alignment devices.
Figure 14B:
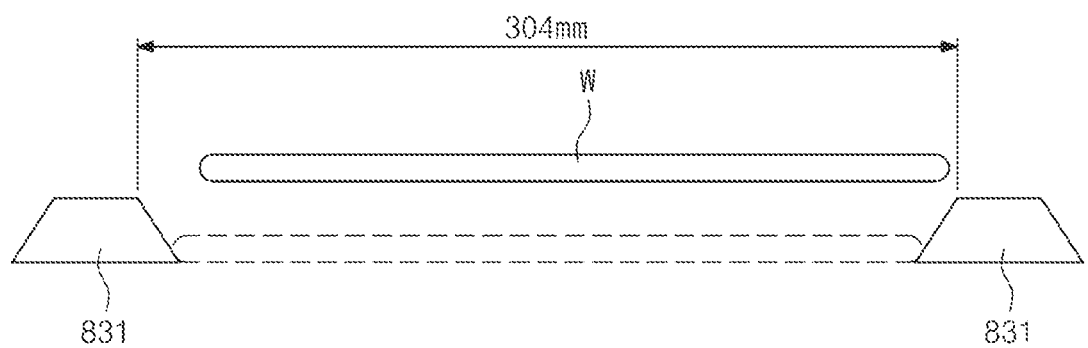
Figure 14C:
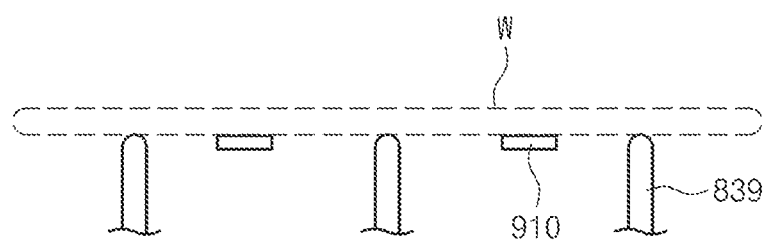
Figure 15:
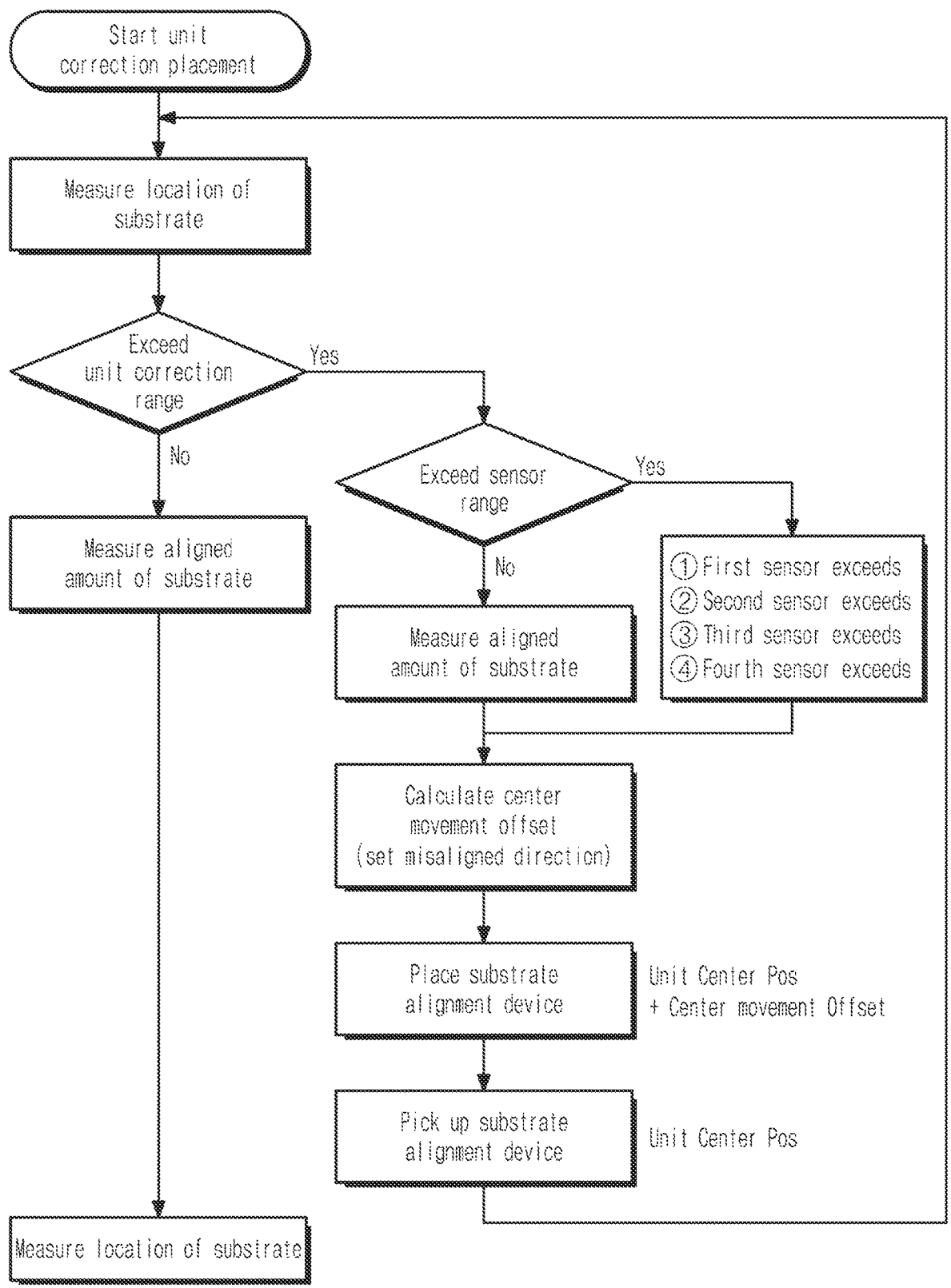
FIG. 15 is a flowchart illustrating a substrate treating method for teaching a substrate on a hand.

FIG. 15 is a flowchart illustrating a substrate treating method for teaching a substrate on a hand. Referring to FIGS. 10 to 15, the teaching unit 930 receives the four end locations on the substrate "W", which are detected by the location detection members 920. The teaching unit 930 detects a center and a misalignment degree of the substrate "W" using the four end locations on the substrate "W". The teaching unit 930 calculates the amount of location deviation of the substrate "W" held by the hand 910 using the detected center of the substrate "W", and transfers the substrate "W" on the basis of the calculated amount of location deviation when the substrate "W" is transferred.

The teaching unit 930 measures the location deviation of the substrate "W" placed on the hand 910 using the location detection members 920, and corrects the transfer location of the hand 910 before the substrate "W" placed on the hand 910 is seated on a substrate alignment unit when the alignment state of the substrate "W" exceeds the sensor reading range.

The teaching unit 930 may determine the misalignment directionality of the substrate "W" using measurement values of the location detection members 920. For example, the misalignment direction of the substrate "W" may be identified through a non detection location sensor, which deviates from the sensor reading range, among the four location detection members.

Figure 11:
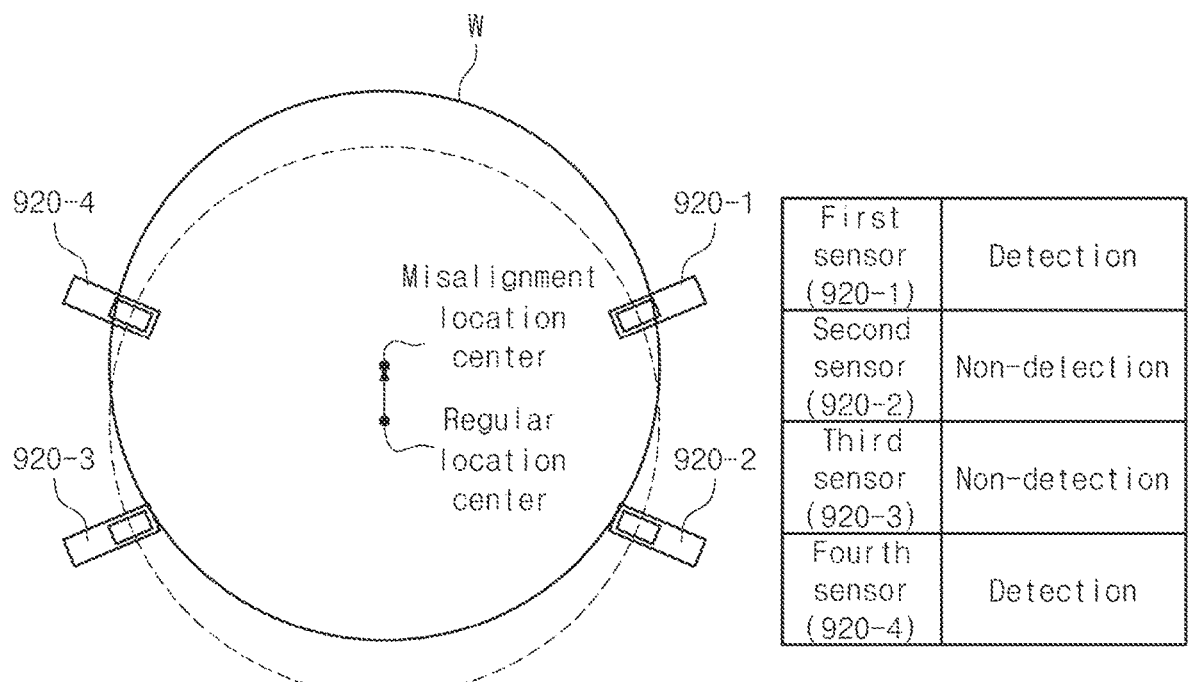
FIGS. 11 and 12 are views illustrating misalignment of the substrate on the hand.

Referring to FIG. 11, when the first sensor 920-1 and the fourth sensor 920-4 detect the substrate "W", and the second and third sensors 920-2 and 920-3 fail to detect the substrate "W", the teaching unit 930 may determine that the substrate "W" is misaligned since the substrate 'W" deviates from the sensor reading range in an approximately 12 o'clock direction (0°). For reference, in the case of the first and fourth sensors 920-1 and 920-4, a relatively smaller amount of light than the amount (50%) of light received in a state in which the substrate "W" is situated at the regular location may be received, and in the case of the second and third sensors 920-2 and 920-3, the light receiving unit 922 may receive the total amount (100%) of light emitted from the light emitting unit 921.

Figure 12:
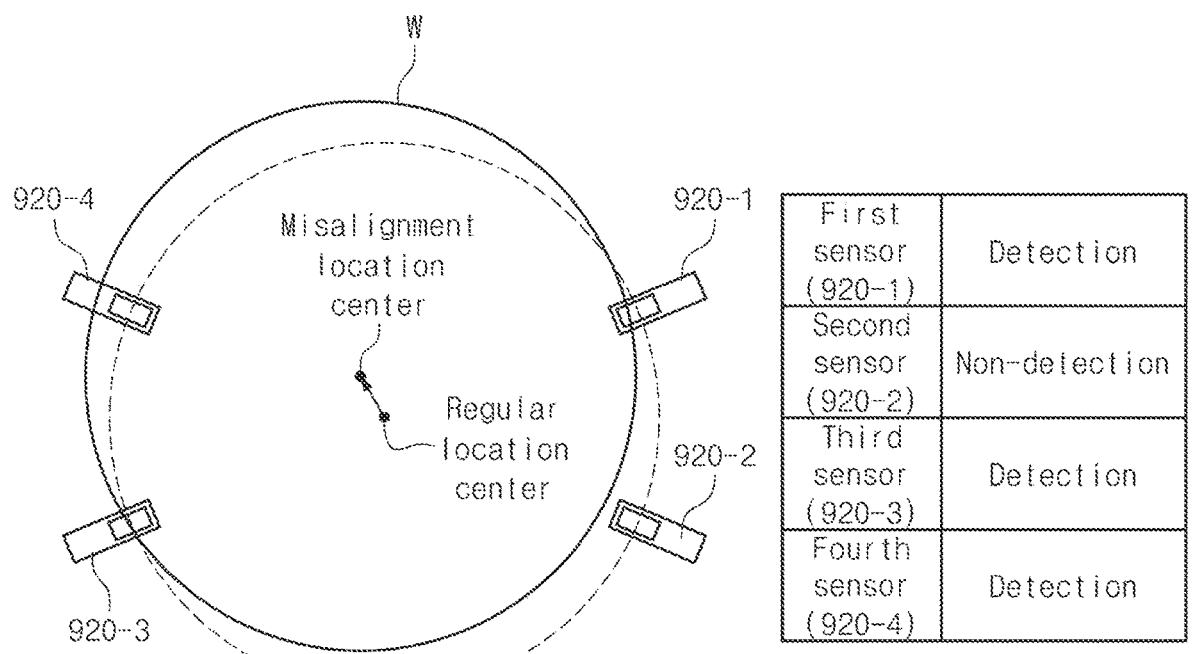

Referring to FIG. 12, when the first sensor 920-1, the third sensor 920-3, and the fourth sensor 920-4 detect the substrate "W", and the second sensor 920-2 fails to detect the substrate "W", the teaching unit 930 may determine that the substrate "W" is misaligned since the substrate "W" deviates from the sensor reading range in a direction (315°) between 10 o'clock and 11 o'clock. For reference, in the case of the fourth sensor 920-4, a relatively smaller amount of light than the amount (for example, 50%) of light received in a state in which the substrate "W" is situated at the regular location may be received. In contrast, in the case of the second sensor 920-2, since the substrate "W" deviates from the sensor reading range, there is no amount of light blocked by the substrate "W", and thus the light receiving unit 922 may receive the total amount (100%) of the light emitted from the light emitting unit 921.

FIG. 13 is a table illustrating a misalignment direction of the substrate through a non-detection sensor deviating from the sensor reading range among the location detection members.

As illustrated in FIG. 13, the teaching unit 930 determines the misalignment directionality of the substrate "W" using the measurement values of the location detection members 920.

In this manner, when the misalignment direction of the substrate "W" is determined, the teaching unit 930 offsets the location of the hand 910 by a preset interval in a direction opposite to the misalignment direction of the substrate. Here, the preset interval (offset movement distance) may correspond to the reading range of the location detection member 920 that is installed in the hand 910 and measures the alignment state of the substrate "W". For example, when the reading range of the location detection member 920 is ±4 mm (PCD 308 mm), the location of the hand 910 is offset by 4 mm in a misalignment direction. (For reference, the substrate accommodation range on the hand 910 is ±6 mm (PCD 312 mm) wider than the sensor reading range)

When the substrate "W" is placed on the substrate alignment device 800 in a state in which the hand 910 is offset by 4 mm, the substrates "W" may be stably aligned within the accommodation range (that is equal to the sensor reading range) of the substrate alignment device 800. Further, when the substrate "W" is brought from the substrate alignment device 800 in a state in which the hand 910 is situated at an original location before the offset, the substrate "W" is located within the reading range of the location detection member.

Figure 2:
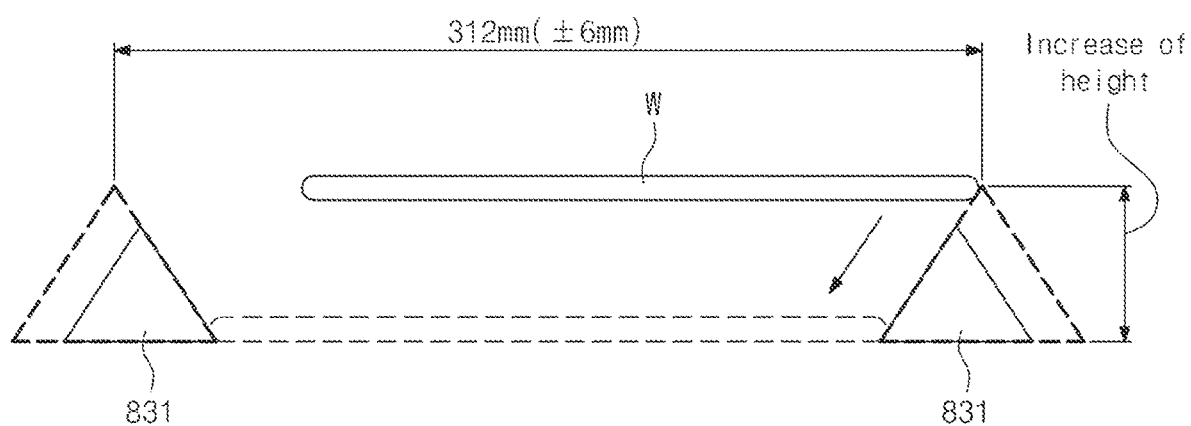
FIG. 2 is a view illustrating a problem when the accommodation range is increased to solve the problem of FIG. 1.

As in FIG. 1, when the offset of the hand 910 by the teaching unit 930 is omitted, the substrates "W" cannot be aligned because the substrates "W" deviate from the accommodation range of the substrate alignment device 800. In order to align the substrate "W" in the substrate alignment device 800 in a state in which the substrate "W" placed on the hand deviates from the sensor reading range, the size of the alignment pin 831 is designed to be large as in FIG. 2. However, when the size of the alignment pin 831 increases, the size (the height) of the substrate alignment device 800 also increases, and this is disadvantageous to the stacked structure.

FIGS. 14A to 14C are views illustrating various types of substrate alignment devices.

FIG. 14A illustrates a general alignment pin having a triangular pyramid shape, and FIG. 14B illustrates the alignment pin having a cone shape. Further, FIG. 14C illustrates a general support pin. In the case of FIG. 14C, after the substrate "W" is placed on support pins 839 in a state in which the substrate "W" is temporarily corrected through the offset operation of the hand 910, the hand 910 picks up the substrate "W" again at a location before the offset operation. Thus, since the substrate "W" on the hand 910 is located within the sensor reading range, the substrate "W" may be transferred using a general teaching method.

Hereinabove, the substrate alignment device, the substrate treating apparatus, and the substrate treating method have been described in detail. However, the inventive concept is not limited to the above-described embodiments, and may be applied to all devices that treat the substrate "W". In particular, the guide unit 830 included in the one embodiment of the inventive concept may be applied to a liquid treating chamber in which a liquid is supplied to the substrate "W" and the substrate "W" is treated and a baking chamber in which the substrate "W" is heated.

According to one embodiment of the inventive concept, even when a misaligned location of a substrate exceeds an accommodation range of a centering buffer unit, the substrate may be efficiently aligned.

The effects of the inventive concept are not limited to the above-mentioned effects, and the unmentioned effects can be clearly understood by those skilled in the art to which the inventive concept pertains from the specification and the accompanying drawings.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A substrate treating method comprising:
   measuring an alignment state of a substrate placed on a hand of a transfer unit configured to transfer the substrate;
   transferring the substrate to a substrate alignment unit by the transfer unit when the alignment state of the substrate exceeds a sensor reading range;
   aligning a location of the substrate by the substrate alignment unit; and
   temporarily correcting the location of the substrate before the substrate is loaded on the substrate alignment unit when it is measured in the measuring of the alignment state that the alignment state of the substrate exceeds the sensor reading range.

2. The substrate treating method of claim 1, wherein the temporarily correcting of the location includes:
   determining misalignment directionality of the substrate using a measurement value of the measuring of the alignment state; and
   offsetting a location of the hand by a preset interval in a direction that is opposite to a misalignment direction of the substrate.

3. The substrate treating method of claim 2, wherein the preset interval corresponds to a reading range of a sensor installed in the hand and configured to measure the alignment state of the substrate.

4. The substrate treating method of claim 2, wherein in the measuring of the alignment state, four sensors installed in the hand detect four end locations on the substrate.

5. The substrate treating method of claim 4, wherein a sensor of the sensors emits light toward the substrate placed in the hand and measures a degree of misalignment of the substrate using an area of detected light.

6. The substrate treating method of claim 4, wherein in the determining of the misalignment directionality, the misalignment direction of the substrate is identified through a non-detection sensor, exceeding the sensor reading range, among the four sensors.

7. A substrate treating apparatus comprising:
   a substrate alignment unit configured to align a substrate;
   a transfer unit that has a hand on which the substrate is placed and location sensors configured to measure a location of the substrate on the hand and is configured to transfer the substrate to the substrate alignment unit; and
   a teaching unit configured to set a transfer location at which the substrate is transferred onto the substrate alignment unit by the transfer unit,
   wherein the teaching unit measures, using the location sensors, positional misalignment of the substrate placed on the hand, and corrects a transfer location of the hand before the substrate placed on the hand is seated on the substrate alignment unit when an alignment state of the substrate exceeds a sensor reading range of the location sensors.

8. The substrate treating apparatus of claim 7, wherein the teaching unit determines misalignment directionality of the substrate using measurement values of the location sensors.

9. The substrate treating apparatus of claim 8, wherein in the teaching unit, four location sensors installed in the hand detect four end locations on the substrate.

10. The substrate treating apparatus of claim 9, wherein the teaching unit identifies a misalignment direction of the substrate through a non-detection location sensor, exceeding the sensor reading range, among the four location sensors.

11. The substrate treating apparatus of claim 10, wherein the teaching unit offsets the transfer location of the hand by a preset interval in a direction that is opposite to the misalignment direction of the substrate.

12. The substrate treating apparatus of claim 11, wherein the preset interval corresponds to a reading range of the location sensor.

13. The substrate treating apparatus of claim 9, wherein the substrate alignment unit includes:
   a support plate; and
   a plurality of alignment pins coupled to an upper surface of the support plate and configured to align the location of the substrate.

14. The substrate treating apparatus of claim 13, wherein the alignment pin has an inclination part having a shape of a cone or truncated cone of which a cross section becomes wider toward a lower side.

* * * * *